United States Patent [19]
Yamane et al.

[11] Patent Number: 5,675,167
[45] Date of Patent: Oct. 7, 1997

[54] ENHANCEMENT-TYPE SEMICONDUCTOR HAVING REDUCED LEAKAGE CURRENT

[75] Inventors: Hiroyuki Yamane, Anjo; Yasushi Higuchi, Okazaki; Mitsutaka Katada, Toyokawa; Noriyuki Iwamori, Okazaki; Tsutomu Kawaguchi, Nagoya; Takeshi Kuzuhara, Nukata-gun, all of Japan

[73] Assignee: Nippondenso Co., Ltd., Kariya, Japan

[21] Appl. No.: 562,629

[22] Filed: Nov. 24, 1995

[30] Foreign Application Priority Data

Nov. 24, 1994 [JP] Japan ................. 6-289883

[51] Int. Cl.⁶ ................. H01L 29/76; H01L 27/01
[52] U.S. Cl. ................. 257/345; 257/348; 257/349; 257/383; 257/388; 257/413
[58] Field of Search ................. 257/345, 348, 257/349, 383, 388, 413

[56] References Cited

U.S. PATENT DOCUMENTS

| | | | |
|---|---|---|---|
| 4,769,686 | 9/1988 | Horiuchi et al. | 257/384 |
| 4,914,492 | 4/1990 | Matsumoto | 257/345 |
| 5,045,916 | 9/1991 | Vor et al. | 257/383 |
| 5,194,749 | 3/1993 | Meguro et al. | 257/69 |
| 5,334,870 | 8/1994 | Katada et al. | |
| 5,444,282 | 8/1995 | Yamaguchi et al. | |
| 5,486,487 | 1/1996 | Ginami et al. | |

FOREIGN PATENT DOCUMENTS

| | | |
|---|---|---|
| 58-148448 | 9/1983 | Japan . |
| 5-136423 | 6/1993 | Japan . |
| 5-291538 | 11/1993 | Japan . |
| 5-326968 | 12/1993 | Japan . |

*Primary Examiner*—Mahshid D. Saadat
*Assistant Examiner*—Valencia Martin Wallace
*Attorney, Agent, or Firm*—Cushman, Darby & Cushman IP Group of Pillsbury Madison & Sutro LLP

[57] ABSTRACT

A semiconductor device having an enhancement-type MOS structure which can prevent large leakage current is disclosed. A high-concentration region for threshold-value regulation use formed in a channel region below a gate electrode in an enhancement-type transistor is caused to be contiguous with a source region and not contiguous with a drain region. Herein, the distance between the high-concentration region and the drain region is set so as to preclude the depletion layer extending from the drain region side from reaching the high-concentration region. Therefore, the electrical field in the depletion layer does not become the critical field which causes avalanche or Zener breakdown, and so leakage current can be caused to be reduced.

10 Claims, 16 Drawing Sheets

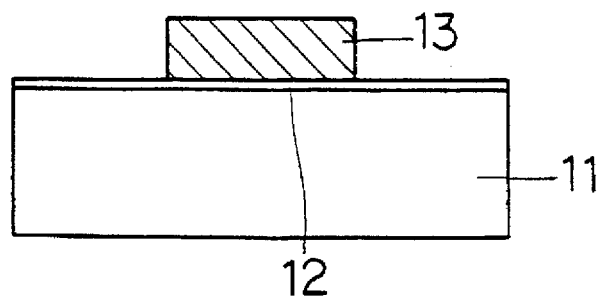
F I G. 2A
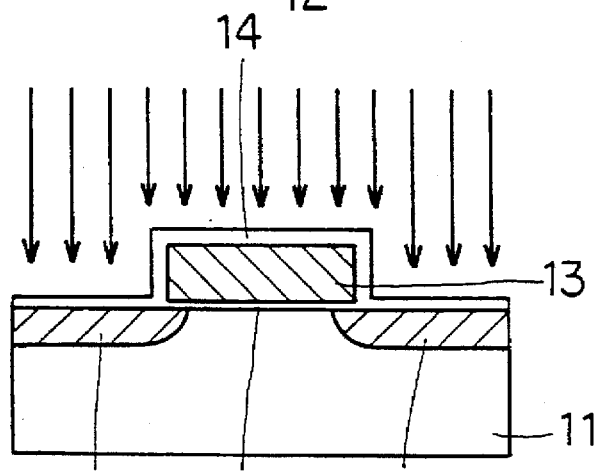
F I G. 2B
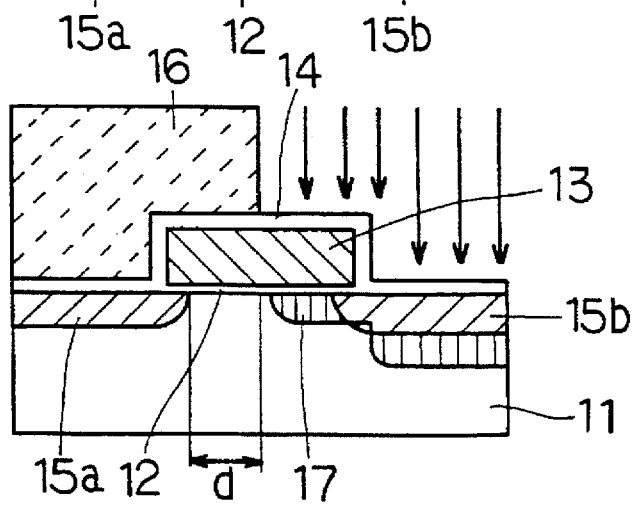
F I G. 2C
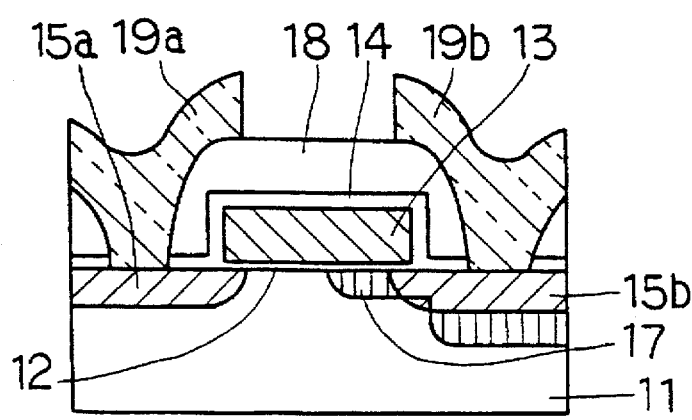
F I G. 2D

F I G. 9
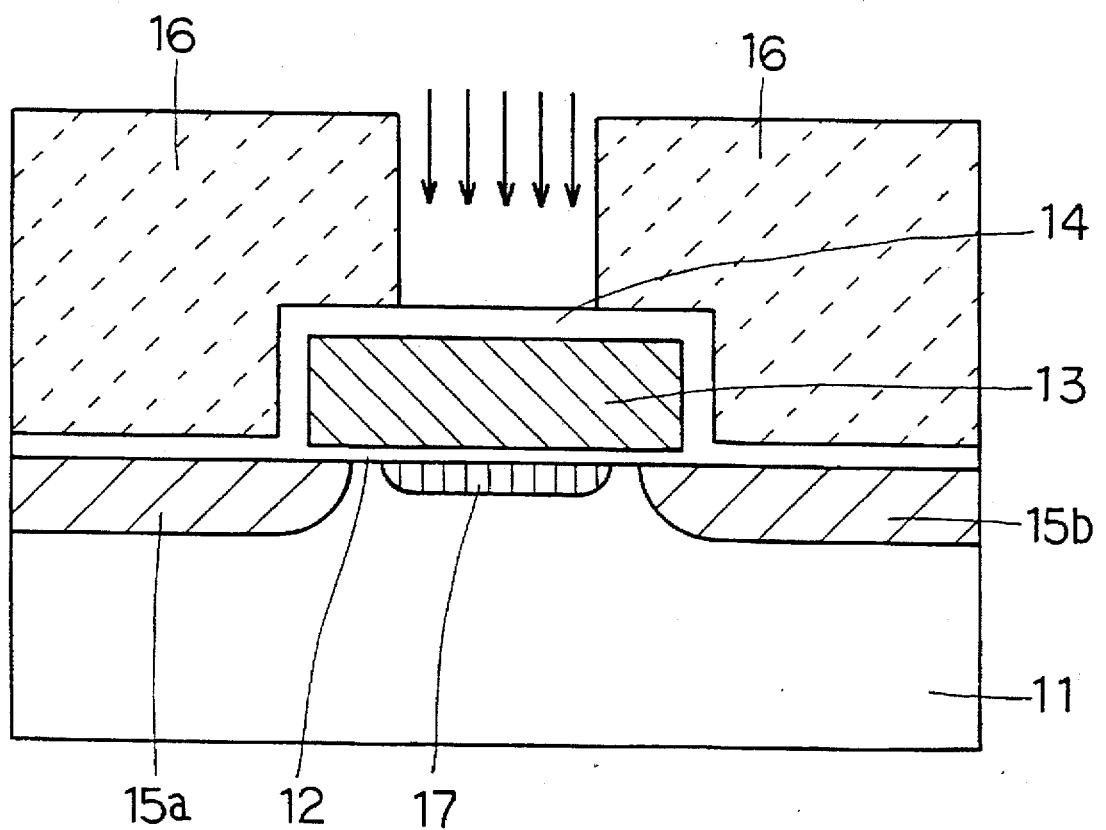

$Rp + n\Delta Rp > t/\cos\theta$ $Rp + n\Delta Rp = t/\cos\theta$ $Rp + n\Delta Rp < t/\cos\theta$ F I G. 12
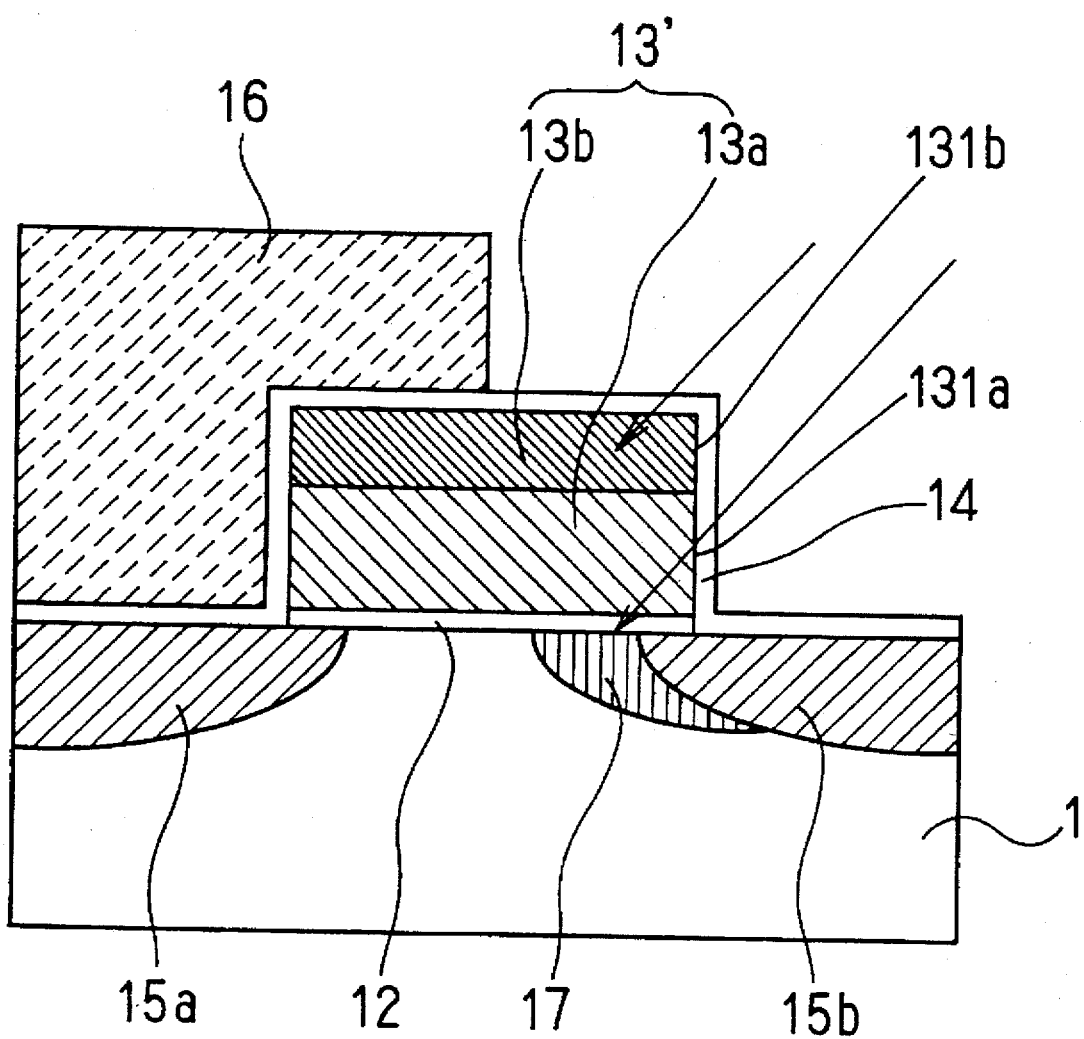

F I G. 14A
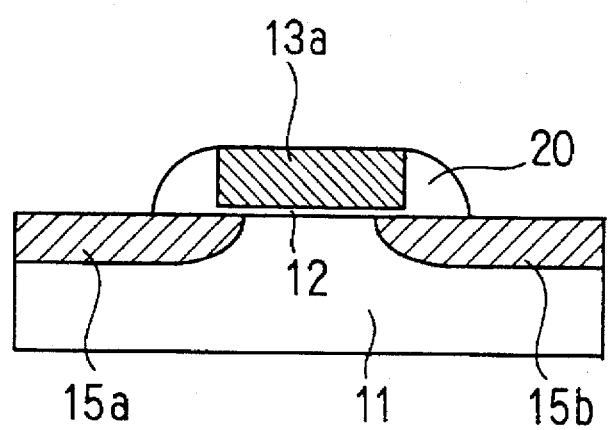
F I G. 14B
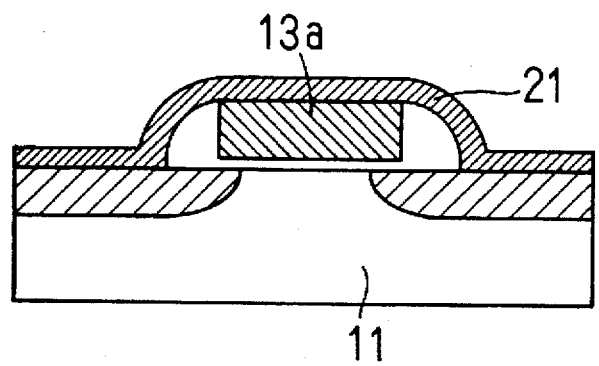
F I G. 14C
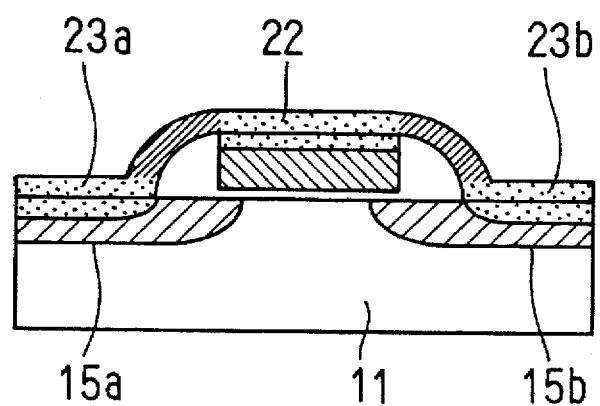
F I G. 14D
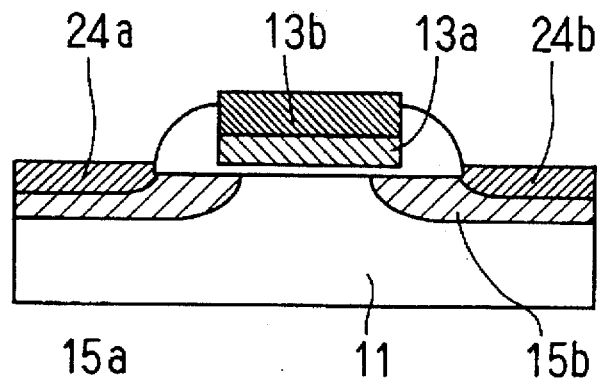

ENHANCEMENT-TYPE SEMICONDUCTOR HAVING REDUCED LEAKAGE CURRENT

CROSS REFERENCE TO RELATED APPLICATION

This application is based upon and claims the benefit of priority of the prior Japanese Patent application No. 6-289883 filed on Nov. 24, 1994, the contents of which are incorporated herein by reference.

BACKGROUND OF THE INVENTION

1. Field of the Invention

The present invention relates to an enhancement-type semiconductor device having an MIS (metal insulator semiconductor) structure and a fabrication process thereof, and relates, for example, to a ROM (read-only memory).

2. Related Arts

Heretofore, when structuring a mask ROM, an enhancement-type ROM transistor has been employed. In this case, a so-called ion-implantation type ROM, the threshold voltage of which is controlled by performing an ion implantation causing impurity ions to pass through a gate electrode to reach a channel region, has frequently been employed.

A fabrication process in a case where this ion-implantation type ROM has been structured by an N-channel transistor will be described with reference to FIGS. 15A through 15D.

In a case of an N-channel transistor, a P-type silicon monocrystalline substrate 11 is oxidized in an oxidizing atmosphere of, for example, oxygen gas, a mixed gas of $H_2O$ and oxygen gas, or the like, to form a gate-oxide film 12, and thereabove is formed a gate electrode 13 of a polycrystalline silicon doped with, for example, a high concentration of phosphorus (FIG. 15A).

Next, a film 14 which is a amorphous oxide film or nitride film is formed to an appropriate thickness over the entire surface of the wafer so that ions implanted during ion implantation which will be described later do not cause channeling of the polycrystalline silicon gate electrode 13. Then, donor dopant (such as arsenic, phosphorus, or both) is implanted and a drain region 15a and source region 15b are formed (FIG. 15B).

Thereafter, in order to create an enhancement-type ROM, a photoresist 16 is formed, and acceptor dopant such as boron, $BF_2$, or the like is implanted in the channel region using the patterned photoresist as a mask to form a high-concentration P-type region 17 of higher doping concentration than the substrate 11 over the entirety of the channel region (FIG. 15C).

Thereafter, a layer insulation film 18 composed of, for example, a BPSG film is formed over the entire surface, contact holes are formed in the layer insulation film 18 so as to reach the drain region 15a and source region 15b, respectively. Furthermore, a metal film of aluminum or the like is formed by a vapor deposition, sputtering, or chemical vapor growth process, and is patterned into a drain electrode 19a and source electrode 19b (FIG. 15D).

An enhancement-type ROM is formed according to the foregoing. Memory functions as this ROM are performed by establishing the doping concentration of the high-concentration P-type region 17. Additionally, in case this enhancement-type ROM is operated, the substrate 11 and source electrode 19b are set at, for example, 0 V, and the drain electrode 19a is set at 1 to 5 V. That is to say, the substrate 11 and source electrode 19b are caused to be equipotential, and the drain electrode 19a is set at a higher potential.

SUMMARY OF THE INVENTION

However, in an enhancement-type ROM structures in the above-described manner, withstand voltage in a region of the channel region contiguous to the drain region 15a becomes low compared with a case in which ion implantation is not performed (i.e., when a high-concentration P-type region is not formed), and a problem occurs in which leakage current from the drain region 15a to the substrate 11 or source region 15b is generated.

According to various investigations conducted by the inventors of the present application with respect to this problem, it is believed that, because a PN junction is defined between the N-type drain region 15a of high concentration and the high-concentration P-type region 17 of the channel region and a high voltage of, for example, approximately 1 to 5 V with respect to the substrate 11 is applied to the drain region 15a, a Zener breakdown or an avalanche breakdown occurs due to the foregoing PN junction, and thereby leakage current becomes large.

Moreover, doping concentration of the high-concentration P-type region 17 formed on the entire surface of the channel region is on an order of $10^{18}/cm^3$ in a case where, for example, doping concentration of the substrate 11 is approximately $10^{16}$–$10^{17}/cm^3$ and each doping concentration of the drain region 15a and source region 15b is approximately $10^{20}/cm^3$.

Consequently, the higher the doping concentration of the high-concentration P-type region 17 of the channel region is caused to be in order to increase threshold voltage in an enhancement-type ROM, the greater is leakage current generated between the channel region and end portion of drain region 15a, and the more withstand voltage declines. Power consumption also increases.

In light of the foregoing problems, it is an object of the present invention to suppress leakage current in a semiconductor device having an enhancement-type MOS structure.

To attain the object, the inventors devised forming the foregoing high-concentration P-type region 17 of the channel region not on the drain side, but from under the gate electrode to the source-region periphery in a semiconductor device having an enhancement-type MOS structure.

However, it was understood that even when a high-concentration P-type region is not formed on the drain region side, if an end portion of the high-concentration P-type region is proximate to an end portion of the drain region, leakage current does not decline sufficiently.

Regarding this, it is believed that when operating voltage (for example 5 V) is actually applied to a transistor of enhancement-type MOS structure, a depletion layer expands from the PN junction between the drain region and channel region in accordance with applied voltage, the depletion layer reaches the high-concentration P-type region and extends into the inside thereof, the electrical field intensity within the depletion layer increases sharply since it is difficult for the depletion layer to extend into the inside of a high-concentration region, the electrical field within the depletion layer becomes the critical field which causes avalanche breakdown or Zener breakdown even if the operating voltage is the maximum rated voltage, and thus leakage current is generated.

Consequently, it is sufficient to determine the position of the high-concentration P-type region so that, even if the depletion layer extending from the PN junction between the drain region and channel region reaches the high-concentration P-type region when operating voltage is applied, the electrical field within the depletion layer does not become the critical field which causes avalanche breakdown or Zener breakdown.

That is to say, a semiconductor device of MIS structure according to the present invention, which has a gate electrode formed on a semiconductor region with a gate insulation film interposed therebetween, source and drain regions making the semiconductor region therebetween a channel region, and a high-concentration region formed of the same conductivity type as the channel region and having a higher doping concentration than the channel region and disposed overlapping with the channel region, is characterized in that the high-concentration region is disposed remotely from at least the drain region, and that an end portion of the high-concentration region is established at a position such that an electrical field within a depletion layer which expands within the semiconductor region from a PN junction defined between the drain region and the semiconductor region toward the high-concentration region does not become the critical field causing avalanche breakdown or Zener breakdown when rated voltage of a time of actual usage is applied between the drain region and the semiconductor region.

Accordingly, when rated voltage is applied between the drain region and the semiconductor region, even if the depletion layer reaches and extends inside the high-concentration region, avalanche breakdown or Zener breakdown does not occur, and thereby increase in leakage current can be suppressed.

Additionally, it is sufficient if the position of the end portion of the high-concentration region, i.e., the distance between the end portion of the high-concentration region and the end portion of the drain region, is established so that the depletion layer extending from the PN junction between the drain region and the semiconductor region toward the high-concentration region does not reach the high-concentration region during actual usage when rated voltage is applied. That is to say, since the distance between the high-concentration region and the drain region is so adjusted as to preclude the depletion layer from reaching the high-concentration region at a voltage not more than the rated voltage, a marked increase in the electrical field intensity within the depletion layer is prohibited more reliably and thus increase in leakage current can be suppressed.

It is also acceptable for the high-concentration region to be disposed remotely also from either the source region or the drain region. In this case, there is no occurrence of large leakage current in either case where the source region or the drain region is applied with an electrical potential which is high with respect to the semiconductor region.

The present invention can be employed as a MIS-type memory. In this case, because leakage current during a stand-by mode can be suppressed, wasteful power consumption can be suppressed.

Also, the present invention can be employed as a MIS-type memory which does not assume an "ON" state during actual usage. In this case, because the memory is constantly in an "OFF" state, current does not flow. Consequently, leakage current as a memory can be suppressed, and so wasteful power consumption can be suppressed.

On the other hand, a fabrication process for a semiconductor device according to the present invention is characterized by a step for forming a high-concentration region. As mentioned above, the high-concentration region is disposed overlapping a channel region which is a semiconductor region located under a gate electrode and between a source region and a drain region, and has the same conductivity type as the channel region. The high-concentration region forming step of the present invention comprises the steps of: providing a mask for ion implantation so as to cover an entirety of the drain region and at least a drain side of the gate electrode; implanting first conductivity type impurity ions in a region not covered by the mask at an acceleration energy allowing the impurity ions to pass through the gate electrode; and forming the high-concentration region disposed remotely from at least the drain region such that an end portion thereof is established at a position where an electrical field within a depletion layer extending within the semiconductor region from a PN junction defined between the drain region and the semiconductor region toward the high-concentration region does not become the critical field causing avalanche breakdown or Zener breakdown when rated voltage of a time of actual usage is applied between the drain region and the semiconductor region.

Consequently, a semiconductor device can be fabricated wherein the leakage current does not increase during a time of actual usage.

In particular, by selecting a position of the mask, it is possible for the high-concentration region to be located at a position where the depletion layer is precluded from reaching the end portion of the high-concentration region during the application of the rated voltage. In this case, since the depletion layer does not reach the high-concentration region, a marked increase in the electrical field intensity within the depletion layer is suppressed, and thus increase in leakage current is suppressed.

Furthermore, establishment of the position of the end portion of the high-concentration region can be controlled by the position of the mask and the implantation angle of ion implantation. Consequently, degree of freedom of the establishment of the position of the end portion of the high-concentration region can be enlarged. That is to say, the position of the end portion of the high-concentration can freely be determined without altering the mask pattern.

It is acceptable to cause oblique ion implantation to form the high-concentration region so as to pass through only a side wall of the gate electrode. By doing so, it becomes possible to further suppress expansion of the high-concentration region to the drain region side. Consequently, it becomes still more difficult for the depletion layer extending toward the high-concentration region to reach the high-concentration region. Accordingly, gate-electrode width can be made to more minute, and the semiconductor device can be made to be compact.

Herein, performing the oblique ion implantation so that implanted ions pass through only the side wall of the gate electrode becomes attainable by forming the gate electrode of a multilayered structure composed of a main gate-electrode material and an ion-implantation inhibiting material for which passage of the impurity ions is more difficult than for the main gate-electrode material. By doing so, the position of the drain-side end portion of the high-concentration region can be defined by only impurity ions channeled from the side wall of the gate electrode, and it becomes possible to cause this end-portion position more proximately to the source-region side. That is to say, it becomes more difficult for the depletion layer to reach the high-concentration region at a time of rated-voltage application. This signifies that it becomes possible to cause gate-electrode width to be further narrowed, and further compactness of the semiconductor device becomes possible.

It is acceptable for the main gate-electrode material to be a silicon-based material, and it is acceptable for the ion-implantation inhibiting material to be a material composed of a metallic compound of metal and silicon. In this case, resistance as the gate electrode can be caused to be reduced, and increase in a resistance value of the gate electrode can be suppressed even when the gate electrode is made to be more minute.

When structuring such multilayered gate electrode, it is acceptable for the main gate-electrode material and the ion-implantation inhibiting material to be laminated and simultaneously patterned. According to this method, the multilayered gate electrode can easily be formed.

It is also acceptable to pattern the main gate-electrode material, forming a gate-electrode pattern, and, after forming the source region and drain region with this gate electrode as a mask, to deposit metal material on the gate-electrode pattern, source region and drain region and perform heat treatment. Through this, the metal compound can be formed between the metal material and the gate-electrode material and, along with this, a compound of semiconductor and metal material can be formed also between the source region and drain region. That is to say, lowering of resistance of the gate electrode and of the source region and drain region can be simultaneously performed.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIGS. 2A through 2D are views indicating a fabrication process of the enhancement-type transistor shown in FIG. 1;

Figure 7:
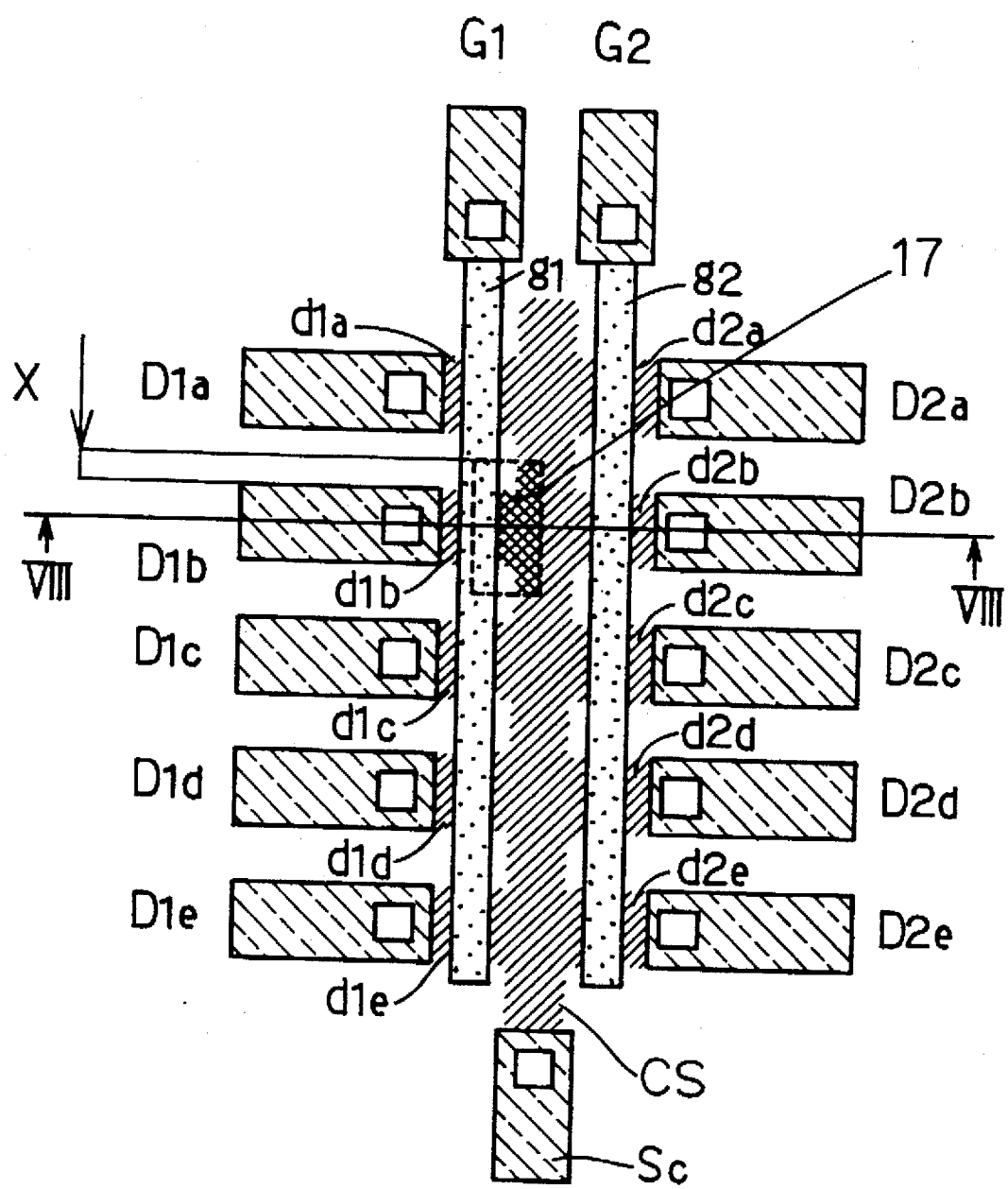
Figure 8:
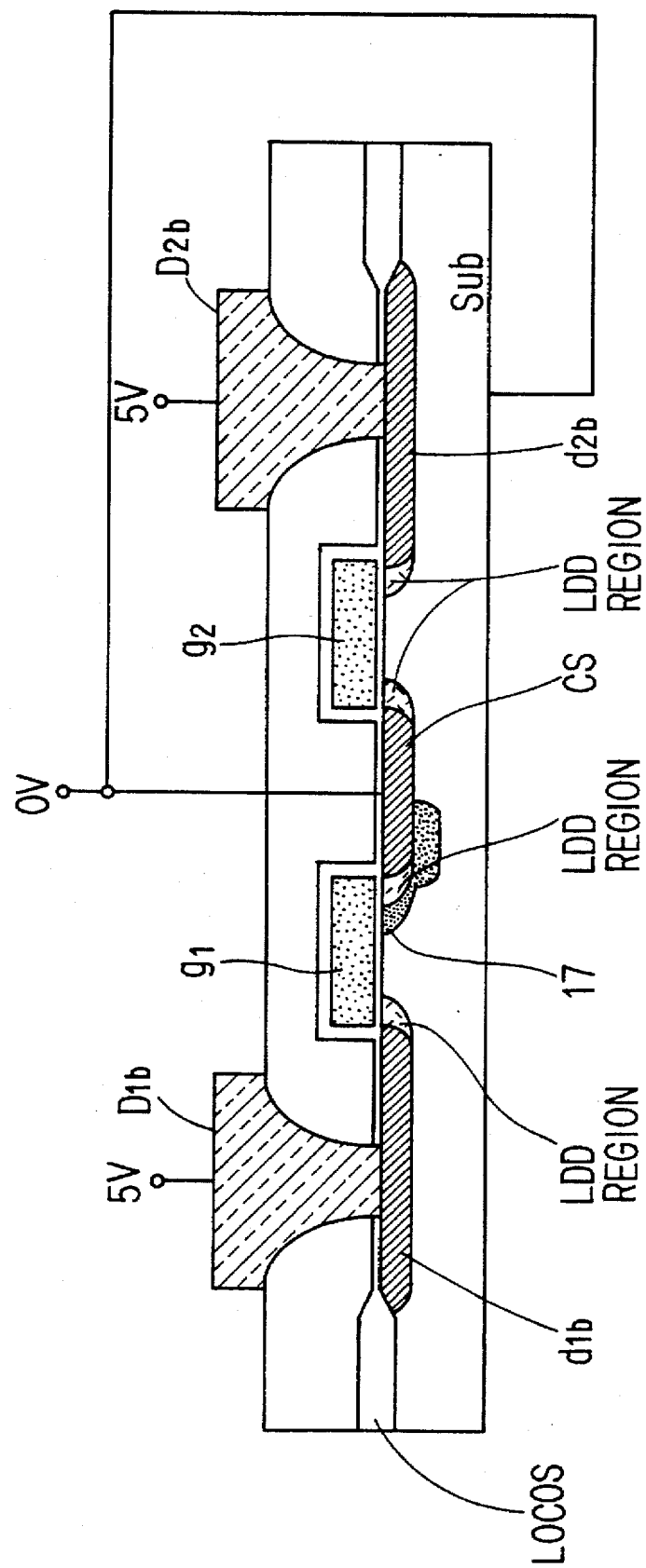
Figure 10:
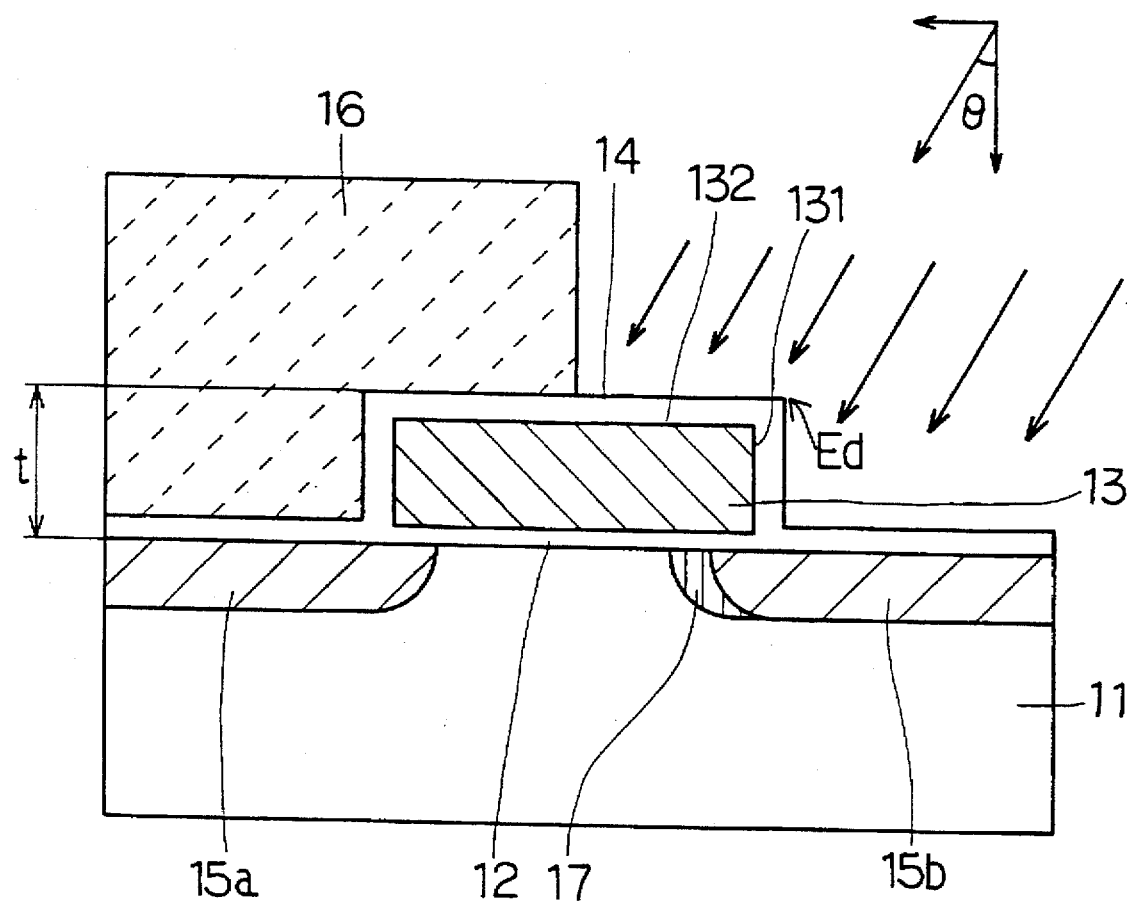

FIG, 7 is a plan view indicating a flat pattern of a NOR-type ROM;

FIG. 8 is a sectional view taken along line VIII—VIII of the NOR-type ROM shown in FIG. 7;

FIG. 9 is a view indicating a state of a certain step of a second embodiment according to the present invention;

FIG. 10 is a view indicating a state of a certain step of a third embodiment according to the present invention;

FIGS. 11A through 11D are diagrams schematically indicating the relationship between the projected range and the implantation depth;

FIG. 12 is a view indicating a state of a certain step of a fourth embodiment according to the present invention;

FIGS. 13A through 13F are views indicating a fabrication process of a device according to the fourth embodiment of the present invention;

FIGS. 14A through 14D are views indicating another fabrication process of a device according to the fourth embodiment of the present invention; and FIGS. 15A through 15D are views indicating a fabrication process of an enhancement-type transistor in a ROM of the prior art.

DETAILED DESCRIPTION OF THE PRESENTLY PREFERRED EXEMPLARY EMBODIMENTS

Modes of embodiment according to the present invention will be described hereinafter with reference to the drawings.

Figure 1:
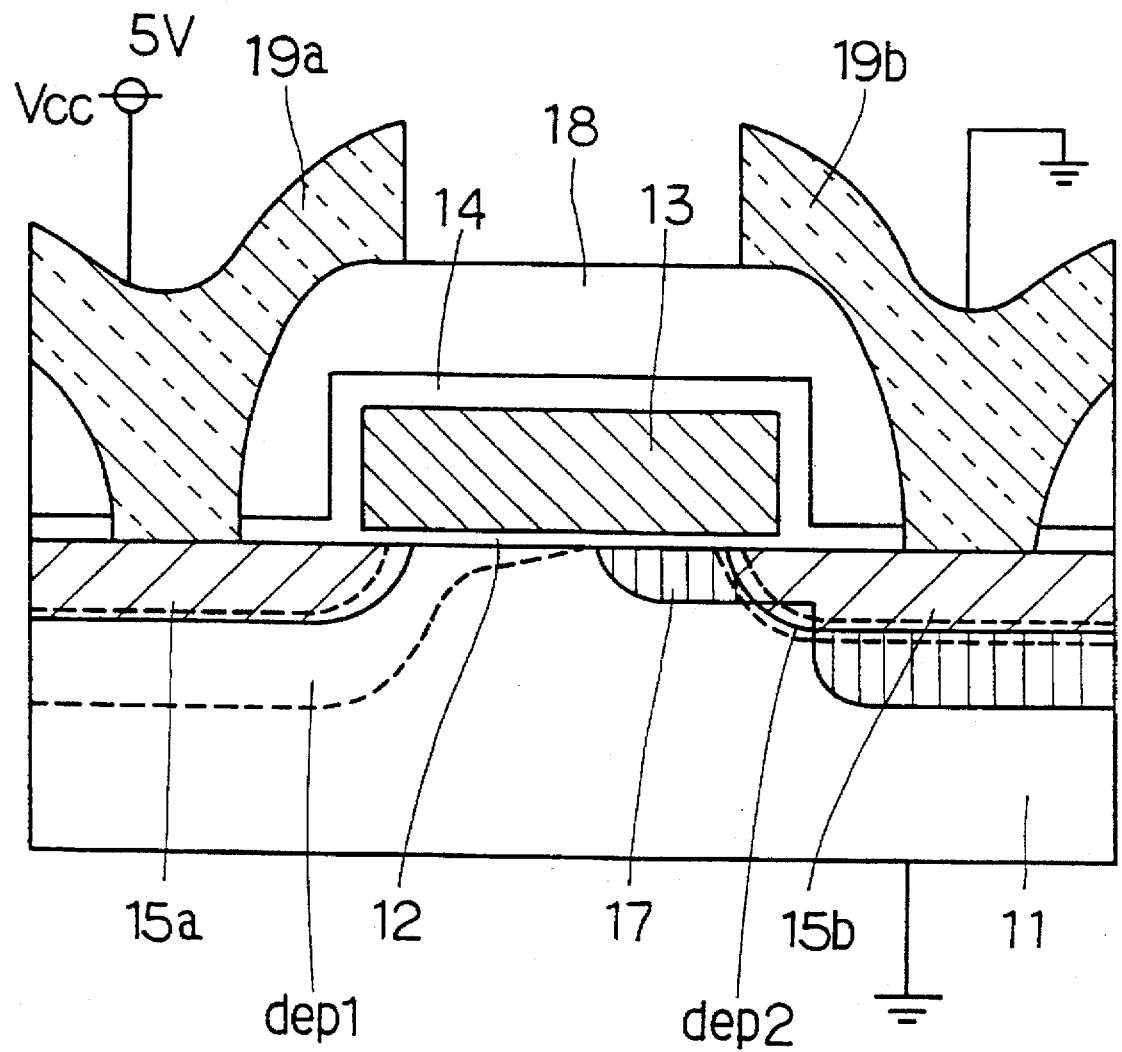
FIG. 1 is a sectional view of an enhancement-type transistor in a NOR-type ROM according to a first embodiment of the present invention.

FIG. 1 shows a first embodiment of the present invention, and indicates a sectional view of a ROM as a semiconductor memory device which is one enhancement-type transistor.

In a MOS transistor having a gate oxide film 12 on a P-type semiconductor substrate (or P-type well region provided in a substrate) 11 and a polycrystalline silicon gate electrode 13 provided further thereabove, a high-concentration P-type region 17 formed by implantation acceptor dopant (for example boron) is formed only in a proximity of a source region 15b, and is structured so that the high-concentration P-type region 17 is not contiguous with a drain region 15a.

In FIG. 1, dotted lines in the proximity of the source and drain regions show expansion states of depletion layers extending under a condition that a drain voltage is set at 5V while a gate voltage, a source voltage and substrate voltage is set at 0V. The depletion layer (dep2) on the side of the source region 15b extends small, but the depletion layer (dep1) on the side of the drain region 15a extends large within the P-type semiconductor substrate 11. As understood from FIG. 1, the depletion layer (dep1) extends toward the high-concentration P-type region 17 at the surface of the semiconductor substrate 11 under the gate electrode 13 where a channel region is defined.

In this embodiment, the position of the drain-side edge of the high-concentration P-type region 17 is adjusted in association with the maximum rated voltage (for example 5V) applied between the drain region 15a and the semiconductor substrate 11 during the actual usage such that, even if the depletion layer (dep1) extending from the PN junction between the drain region 15a and the semiconductor substrate 11 reaches the high-concentration P-type region 17 and further extends therein, the internal electrical field of the depletion layer (dep1) is precluded from becoming the critical field which causes avalanche breakdown or Zener breakdown.

Consequently, since the internal electrical field of the depletion layer does not become the critical field causing breakdown during the application of the rated voltage, an increase in leakage current based on the breakdown is prevented. Therefore, even in a case where doping concentration of the high-concentration P-type region 17 is made high and thereby threshold voltage is elevated, large leakage current flowing between the drain region 15a and the semiconductor substrate 11 or the source region 15b is prevented from occurring, and thus withstand voltage can be caused to be high in comparison with the prior art.

Herein, as is well-known in the art, the mode of the induced breakdown, i.e., avalanche breakdown or Zener breakdown, depends upon the impurity concentration of the drain region 15a and the impurity concentration of the channel region or the high-concentration P-type region 17. In case the impurity concentration of the channel region is relatively high, Zener breakdown based on tunnel effect occurs. On the other hand, in case the impurity concentration of the channel region is not so high, impact ionization of electron due to the intense electrical field is generated before the occurrence of the tunnel effect, and thus large amount of current becomes to flow. Such mode of the breakdown is called avalanche breakdown. Also, there is a case where Zener breakdown and avalanche breakdown occur simultaneously.

A fabrication process of the foregoing enhancement-type transistor will be described next with reference to FIGS. 2A through 2D.

Figure 15A:
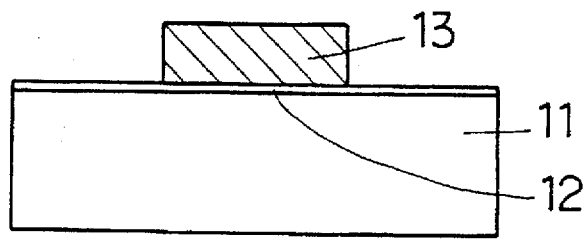
Figure 15B:
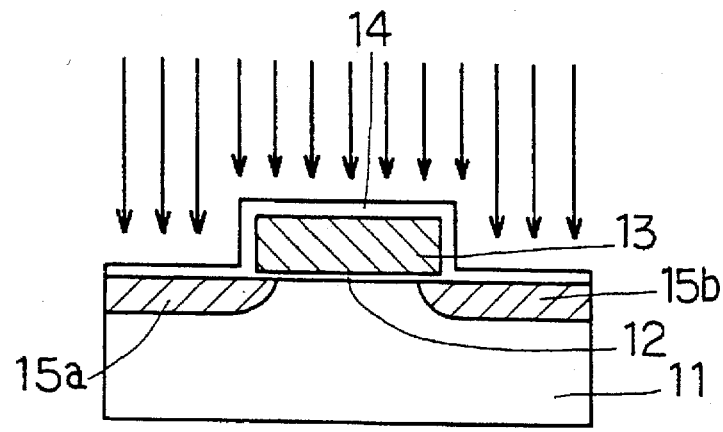
Figure 15C:
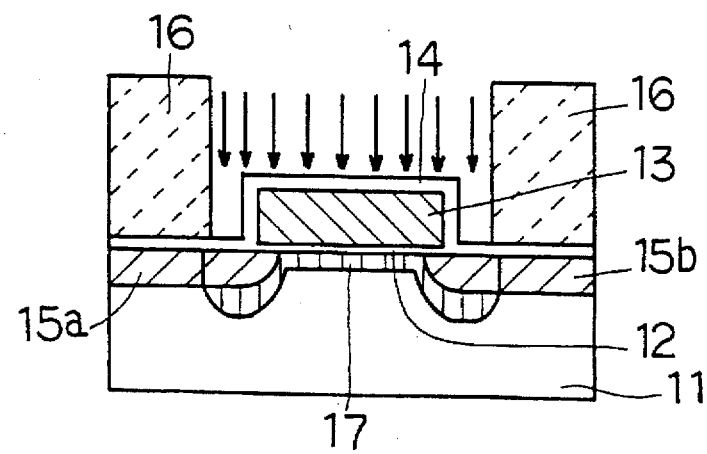
Figure 15D:
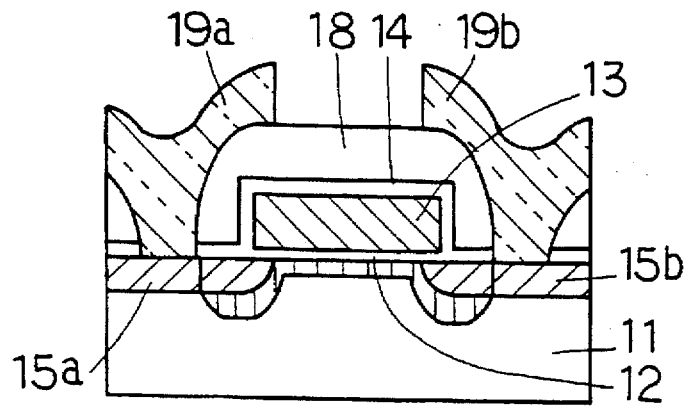

The steps indicated in FIGS. 2A and 2B are identical to the respective steps indicated in FIGS. 15A and 15B, and so description thereof will be omitted.

In the step shown in FIG. 2C, a region including the drain region 15a and a predetermined position above the gate electrode 13 is covered with a photoresist 16 which is a mask, and thereafter, acceptor dopant (for example boron) is ion implanted and heat treatment for activation is performed, and thereby the high-concentration P-type region 17 having a high acceptor-dopant concentration is formed only in the proximity of the source-side of the substrate 11 under the gate electrode 13.

When the ion dose and acceleration voltage of this ion implantation are varied appropriately and concentration of the high-concentration P-type region 17 is established at a predetermined value, threshold voltage can be established at a desired value. In specific terms, when a projected range $R_p$ of ions is established at acceleration energy which allows ions to pass through the gate oxide film 12, the gate electrode 13 and a side-wall film 14, control of the threshold voltage with good reproducibility is possible.

That is to say, ion implantation which is caused to pass through the gate electrode 13 and the gate oxide film is performed in a region not covered by the photoresist 16, forming the high-concentration P-type region 17, and so the threshold can be caused to be shifted with stability. Along with this, the shift amount of the threshold can easily be increased merely by varying the ion-implantation amount, even in a case where the high-concentration P-type region is formed only in the proximity of the source side by causing passage through the gate electrode. This can solve an extremely difficult pointing a case where ion implantation is performed with the gate electrode as a mask and the high-concentration P-type region is formed by thermal diffusion.

This projected range $R_p$ is a value indicating implantation depth of ion implantation, and indicates a depth at which an amount of implanted ions is greatest. Consequently, an ion-implanted region naturally has distribution, and spread with respect to direction of depth (standard deviation) is taken to be $\Delta R_p$, and spread with respect to the horizontal direction (standard deviation) is taken to be $\Delta R_{px}$.

Consequently, it is necessary to give consideration to this $\Delta R_p$ and $\Delta R_{px}$ and regulate the acceleration energy of ion implantation and the position of the photoresist or the injection angle of ion implantation at the time of ion implantation. For example, in a case where the forming region of the high-concentration P-type region is varied, the need to alter the pattern of the photoresist may be eliminated when the injection angle is varied.

Additionally, the distance (distance from drain-region end portion to photoresist end portion) d at which the photoresist provides covering above the gate electrode 13 at this time must be set as described following, with consideration given to the extent of the horizontal spread standard deviation $\Delta R_{px}$ corresponding to the acceleration energy from the boundary of the drain region 15a and the channel region.

Namely, when an operating voltage (for example 5 V) has been applied to the drain region 15a, a depletion layer expands from the PN junction between the drain region 15a and the P-type semiconductor substrate 11. Accordingly, it is necessary to established the distance so that, even if this depletion layer reaches the high-concentration P-type region 17, the electrical field within the depletion layer given by the applied voltage of 5 V does not become the critical field causing avalanche or Zener breakdown, or the extension of the depletion layer stops at an end portion of the high-concentration P-type region 17 and the depletion layer hardly expands into the inside of the high-concentration P-type region 17. By doing this, increase in electrical field intensity due to the extension of the depletion layer within the high-concentration P-type region is suppressed, and so increase in leakage current can be suppressed.

Additionally, when distance is set to preclude the depletion layer (depl) from reaching the end portion of the high-concentration P-type region 17 at the foregoing operating voltage, increase in leakage current can be suppressed more reliably. The foregoing operating voltage refers to a rated voltage at a time of actual usage.

In specific terms, in a case where passage through a polysilicon gate electrode 12 to 350 nm thickness and a side-wall film 14 of 100 nm thickness is caused, 0.05 μm or more is appropriate as distance d.

By covering the drain region 15a with the photoresist 16 so that the high-concentration P-type region 17 is not formed up to the proximity of the drain region 15a, occurrence of leakage current from the drain region 15a to the substrate 11 or to the source region 15b can be prevented.

Figure 3:
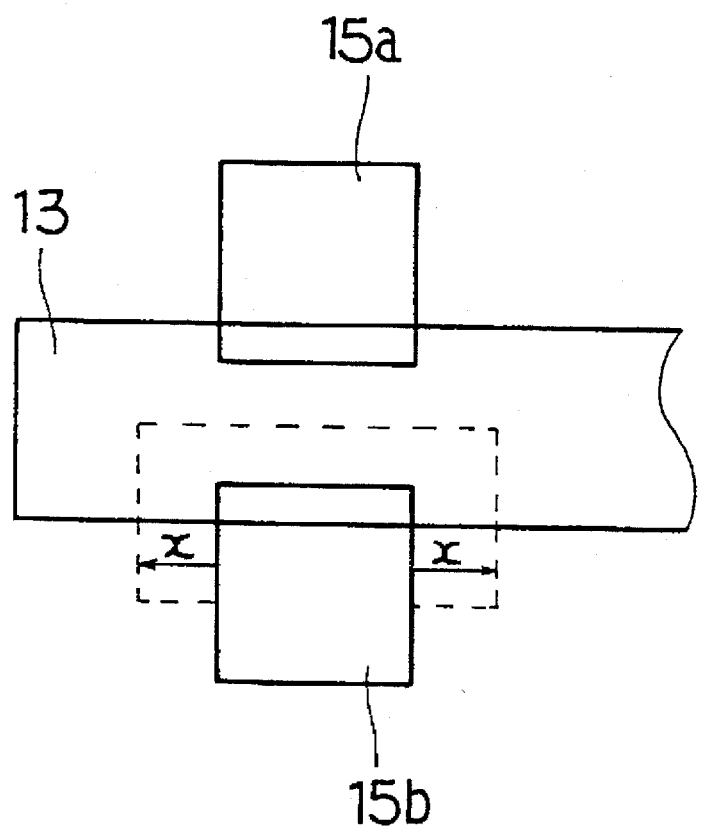
FIG. 3 is an explanatory plan view to describe arrangement of a mask pattern.

As shown in FIG. 3, distance x from the source region 15b end of the mask pattern (i.e., the region indicated by broken lines in the drawing) takes a value greater than zero, so that the extent of overlap with the source region 15b is not diminished. In this case, a value providing a margin in consideration of resist misregistration is used. Fluctuation in threshold voltage due to resist misregistration can thereby be suppressed, and a comparatively stabilized value can be obtained.

Thereafter, the photoresist 16 is removed, a layer insulation film 18 of, for example, a PSG film, BPSG film or the like is formed over the entire surface by a method of, for example, CVD, sputtering, vapor deposition or the like, contact holes are made in portions where drain and source electrodes are provided, a metal of aluminum or the like is vapor-deposited and patterned to form a drain electrode 19a and source electrode 19b (FIG. 2D).

Through the above, the enhancement-type transistor in the NOR-type mask ROM indicated in FIG. 1 is fabricated.

Change in threshold voltage and change in leakage current at a time of ion implantation by causing the position of the photoresist 16 covering the high-concentration P-type region to be changed will be described hereinafter with reference to FIGS. 4A and 4B.

Figure 4A:
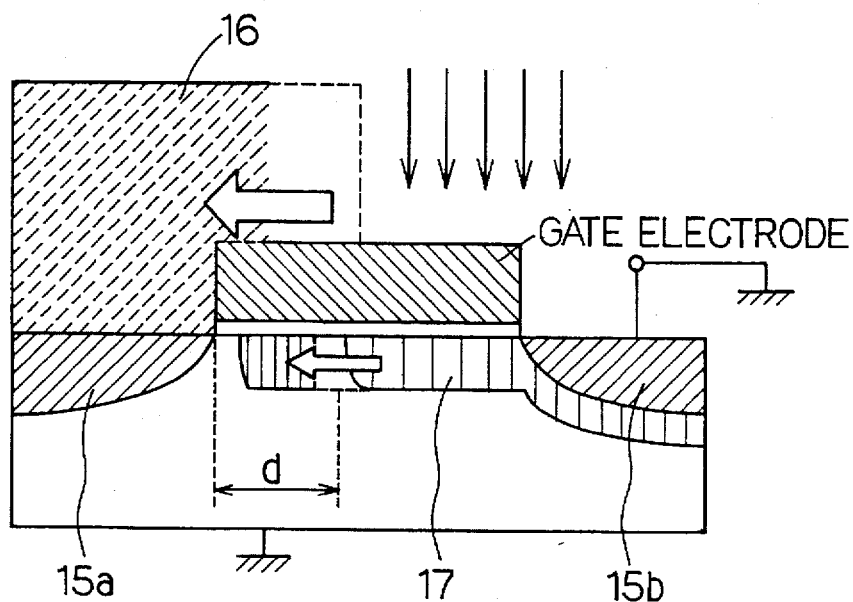
FIG. 4A is sectional view to describe a state of alteration of mask position when forming high-concentration P-type region in an enhancement-type transistor.

FIG. 4A is a schematic cross-sectional view indicating change in distance d between the end portion of the drain region 15a and the end portion of the high-concentration P-type region 17 when the position of the photoresist 16 is caused to be changed. The present sample is formed as follows: The high-concentration P-type region 17 is formed by implanting boron ions with a dose of $1.5 \times 10^{14}$ cm$^{-2}$ and at an acceleration voltage of 145 keV, and is formed with a dopant concentration of $4.5 \times 10^{18}$ cm$^{-3}$. Though the gate length of the gate electrode 13 is set to be 1.0 μm, an effective gate-electrode length, which corresponds to an effective channel length, is 0.8 μm because the drain region 15a and the source region 15b are laterally diffused under the gate electrode 13 by 0.1 μm each. FIG. 4A shows simply the effective gate-electrode length, and the position of 0.4 μm in the graph of FIG. 4B becomes the center of the gate electrode.

Figure 4B:
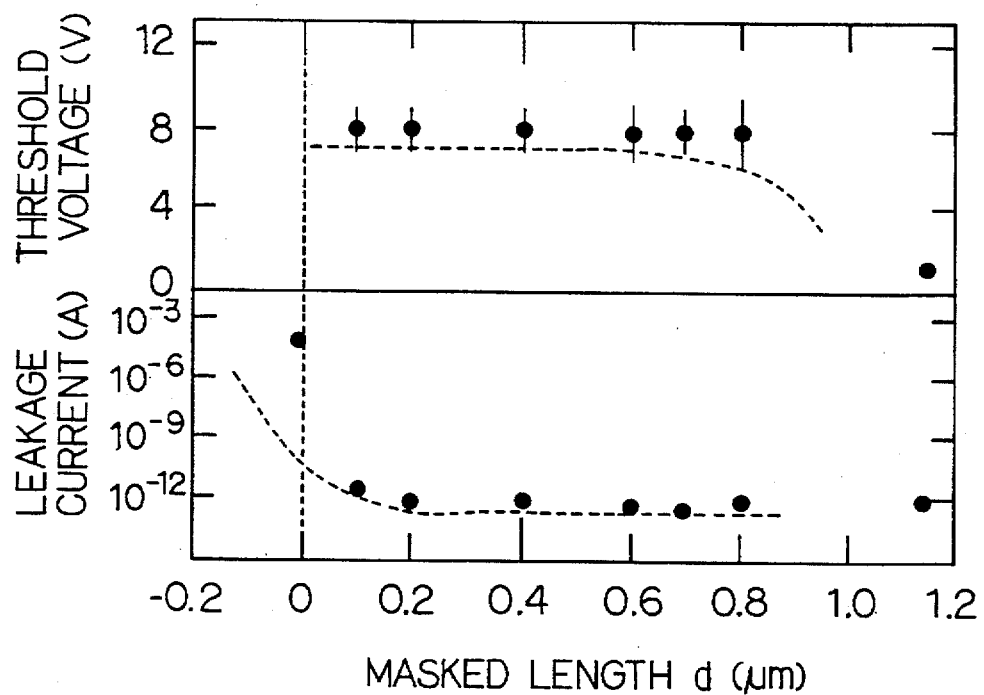
FIG. 4B is a graph indicating threshold voltage and leakage current when a mask position has been caused to be altered when forming high-concentration P-type region.

FIG. 4B is a graph indicating, with simulation data and actual measured data, how threshold voltage and leakage current change when a voltage of 5 V which is equivalent to a ROM operating voltage is applied to the drain region 15a in samples formed by causing the photoresist position to be changed. In the graph, simulation results are indicated by broken lines and actual measured values are indicated by solid circles. The actual measured values are mean values when number of samples n=5. Spread in the horizontal direction at the time of ion implantation is only approximately 0.1 μm to the drain-region side with respect to the end portion of the photoresist 16.

In FIG. 4B, the 0 μm position at the photoresist position, which is the horizontal axis of the graph, is when the photoresist 16 is positioned at the gate-electrode end of the drain region 15a side. When ion implantation is performed in this state, the high-concentration P-type region 17 becomes sufficiently contiguous to the drain region 15a due to the spread in the horizontal direction of the dopant ions.

It is understood from the graph of FIG. 4B that in both the simulation results and the actual measured values, when the position of the photoresist 16 is smaller than approximately 0.1 μm (i.e., when the high-concentration P-type region approaches the drain region 15a), leakage current suddenly increases. It is considered from this graph that when the high-concentration P-type region 17 is proximate to the drain region 15a, the depletion layer extending from the drain region 15a reaches the high-concentration P-type region 17, avalanche breakdown or Zener breakdown occurs, and thus increase in leakage current is induced. Therefore, it is necessary to for the high-concentration P-type region to be separated from the drain region 15a by a predetermined distance. It is necessary that the predetermined distance be taken to be a distance wherein, even if the depletion layer reaches the high-concentration P-type region 17, the electrical field within the depletion layer does not become the critical field.

However, when the depletion layer reaches the high-concentration P-type region 17 and further extends therein, the electrical field within the depletion layer sharply increases, and avalanche breakdown or Zener breakdown readily occurs. Therefore, it is preferable that the predetermined distance be taken to be a distance at which the depletion layer extending from the drain region 15a side does not reach the high-concentration P-type region 17, or a distance at which the depletion layer extending from the drain region 15a side does not extend in the high-concentration P-type region 17 even if the depletion layer reaches the high-concentration P-type region 17. By doing so, the marked increase in the electrical field intensity within the depletion layer is suppressed, and as a result of this, leakage current due to the avalanche or Zener breakdown hardly occurs. Namely, increase in leakage current is effectively suppressed.

Figure 5A:
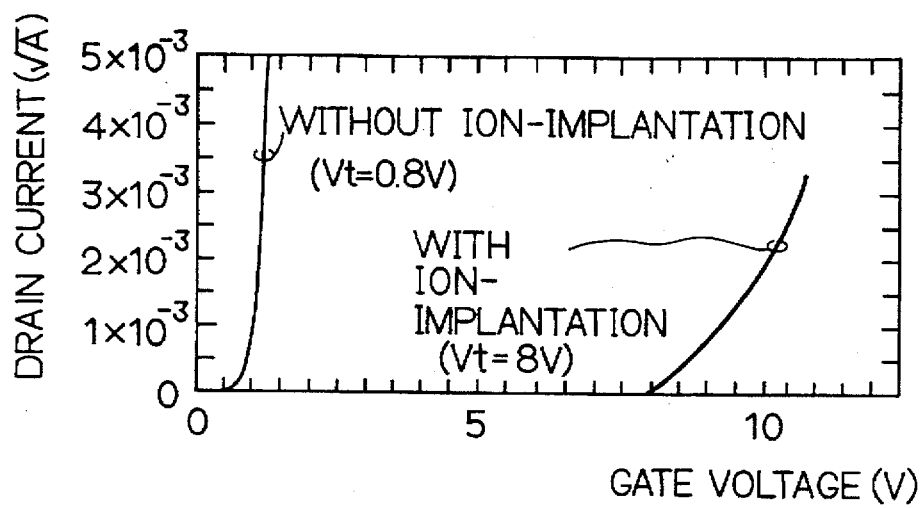
FIG. 5A is a graph indicating threshold value evaluation results of the prior art and a device according to the first embodiment.
Figure 5B:
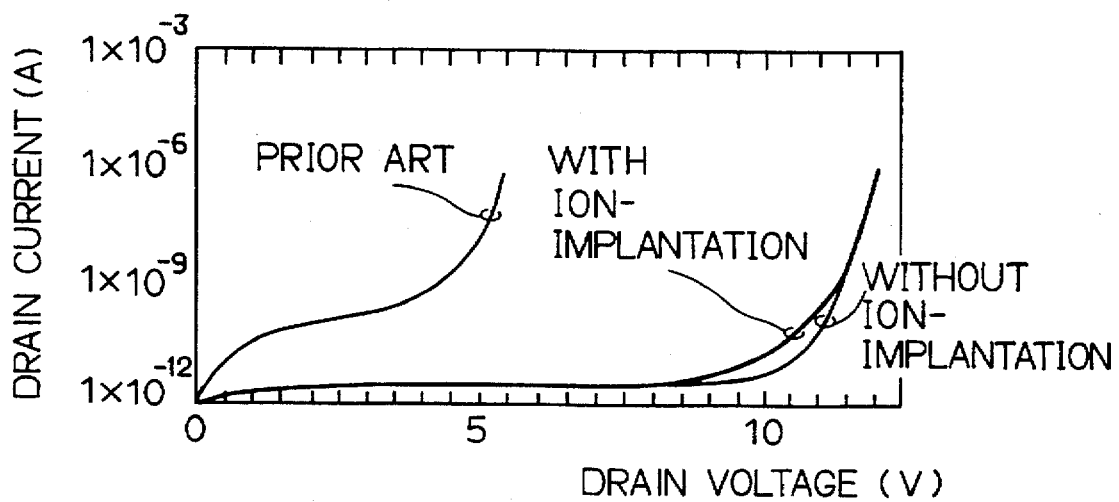
FIG. 5B is a graph indicating leakage current when drain voltage of the prior art and a device according to the first embodiment have been respectively caused to be altered.

FIGS. 5A and 5B indicate threshold voltage characteristics (FIG. 5A) and leakage voltage characteristics (FIG. 5B) employing samples from among samples such as is indicated in FIG. 4A wherein the position of the photoresist 16 was established at the position of 0.5 μm indicated in FIG. 4B, i.e., wherein the high-concentration P-type region was created at conditions identical to the samples indicated in FIG. 4A with establishment at 0.1 μm closer to the source region 15b than to the gate-electrode center (0.4 μm). At this time, distance d between the drain region 15a and the high-concentration P-type region 17 becomes 0.4 μm because the ion-implanted boron ions expand by 0.1 μm in the horizontal direction.

FIG. 5A is a graph indicating drain current when gate voltage has been caused to be changed. It is understood from FIG. 5A that threshold voltage $V_t$ which was 0.8 V prior to forming the high-concentration P-type region is 8 V after forming the high-concentration P-type region, and functioning as a memory is sufficient.

FIG. 5B is a graph indicating current flowing from the drain when drain voltage has been caused to be changed in a state where voltage is not applied to the gate electrode, i.e., leakage current. It is understood from this graph with respect to leakage current (drain current) that whereas leakage current is an extremely large $1 \times 10^{-9}$ to $1 \times 10^{-6}$ A at a voltage proximately to an operating voltage (rated voltage) of 5 V in samples according to the prior art where the high-concentration P-type region was formed up to the drain region 15a, leakage current is an extremely small approximately $1 \times 10^{-11}$ A at an operating voltage of 5 V in samples according to the present embodiment. Accordingly, leakage current can be suppressed to a low level up to a drain voltage of approximately 10 V. Additionally, it is clearly understood that the extent of leakage current is substantially identical in a case where the high-concentration P-type region is formed in the proximity of the source region 15b ("WITH ION-IMPLANTATION" in FIG. 5B) and in a case where a high-concentration P-type region is not formed ("WITHOUT ION-IMPLANTATION" in FIG. 5B), and leakage current is suppressed to an extremely low level in the samples according to the present embodiment.

Figure 6:
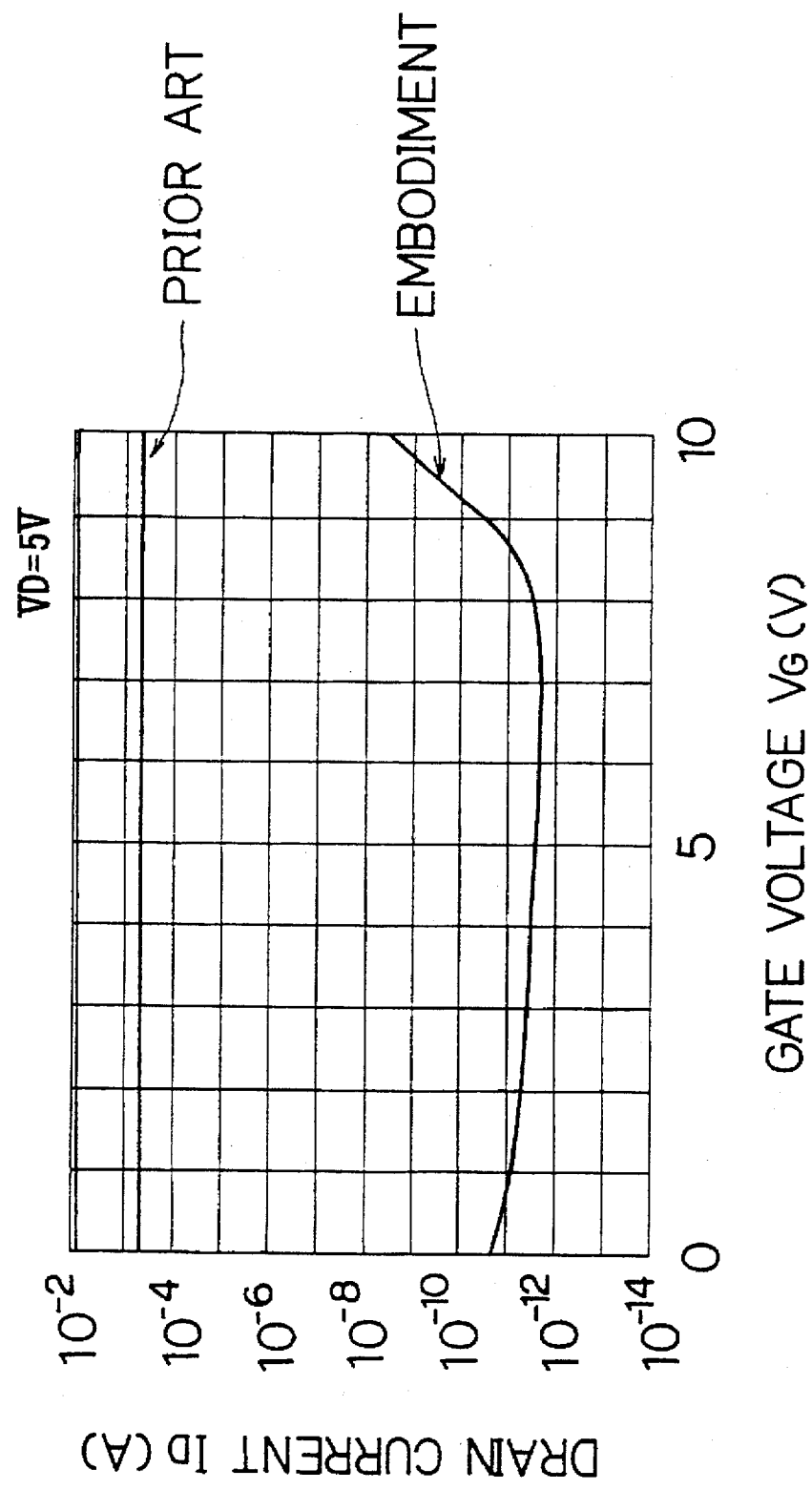
FIG. 6 is a graph indicating leakage current evaluation results of the prior art and a device according to the first embodiment.

Furthermore, FIG. 6 indicates leakage characteristic evaluation results of an enhancement-type ROM according to the prior art (FIG. 15D) and an enhancement-type ROM according to the present embodiment (FIG. 1). Both ROMs have a threshold voltage of 11 V. Whereas according to the prior art approximately 1 mA of leakage current flows and utilization as a memory is impossible, according to the present embodiment leakage current is at a level of 10 pA or less, and leakage current presents absolutely no problem in actual usage.

FIGS. 7 and 8 indicate an enhancement-type transistor according to the above-described present embodiment employed in a NOR-type ROM.

FIG. 7 indicates a portion of a flat pattern diagram of the NOR-type ROM. In the NOR-type ROM, transistors are connected with a common source region. CS is the common source region, and $S_c$ is a source pullout electrode. In addition, $d_{1a}$ through $d_{1e}$ and $d_{2a}$ through $d_{2e}$ indicate respective drain regions, and $D_{1a}$ through $D_{1e}$ and $D_{2a}$ through $D_{2e}$ indicate respective drain pullout electrodes. Furthermore, $g_1$ and $g_2$ indicate gate electrodes, and $G_1$ and $G_2$ indicate respective gate pullout electrodes. The square regions in the centers of the respective pullout electrodes represent contact regions of the respective pullout electrodes and the drain regions, common source region, and gate electrodes.

Furthermore, numeral 17 indicated in the drawing corresponds to the high-concentration P-type region of the above-described embodiment. This high-concentration P-type region 17 is formed only in the common source-region side, and similarly to the pattern indicated in FIG. 3, x is established so that this high-concentration P-type region 17 becomes larger than a source-region end of the common source region CS contiguous with the gate electrode $g_1$.

FIG. 8 is a sectional view taken along line VIII—VIII of the pattern diagram shown in FIG. 7, and the high-concentration P-type region 17 is formed only proximately to the common source region CS at a transistor on the gate electrode $g_1$ side. In this ROM, LDD regions for field alleviation having a doping concentration lower than the drain region and source region are respectively formed so as to be position more under the gate electrode than the source region and drain region. At a time of actual usage, operating voltage of 5 V is applied to the drain region, and the common source region and a substrate (Sub) are grounded. Because threshold voltage is raised by the high-concentration P-type region 17 at this time even if read voltage is applied to the gate electrode $g_1$, no channel is formed between the drain region $d_{1b}$ and the common source region CS, no current flows and so potential of the drain region $d_{1b}$ remains at 5 V. Meanwhile, when read voltage is applied to the gate electrode $g_2$, since a high-concentration P-type region does not exist on the gate electrode $g_2$ side of the common source electrode CS, a channel is formed between the drain region $d_{2b}$ and the common source region CS, current flows and the drain region $d_{2b}$ goes to ground potential.

FIG. 9 indicates a second embodiment according to the present invention.

In this second embodiment, both a drain region 15a and a source region 15b are set such that a high-concentration P-type region 17 is not contiguous. FIG. 9 indicates a portion corresponding to the step in FIG. 2C.

In an enhancement-type ROM obtained by the step indicated in this FIG. 9, heavily leakage current is not generated even when high potential with respect to a substrate 11 is applied to both the drain region 15a and the source region 15b. Moreover, because the source and drain regions can be utilized oppositely, there exists an advantage that a degree of freedom in circuit design is improved.

FIG. 10 indicates a third embodiment according to the present invention.

In this third embodiment, in contrast to the above-described first embodiment, ion implantation to cause threshold voltage to be raised is performed from an oblique direction (approximately 45 degrees is employed as an implantation angle θ) to form a high-concentration P-type region 17. FIG. 10 indicates a portion corresponding to the step in FIG. 2C.

In this case, when acceleration voltage (or acceleration energy) at a time of ion implantation is regulated, i.e., established so that ions injected from a side surface 131 of a gate electrode 13 reach a channel region and ions injected from an upper surface 132 of the gate electrode 13 do not reach the channel region, ions reach only a proximity of the source region 15b, and an effect similar to the first embodiment is obtained.

A concept of a method of regulation of acceleration voltage in ion implantation will be described with reference to FIGS. 11A through 11D.

Implantation depth of ion implantation is generally expressed by a projected range $R_p$. However, implanted ions have distribution with respect to the direction of depth. Therefore, in a case where careful thought is given to the implantation depth of the ions as, for example, in the present case (i.e., a case where ions injected from the gate-electrode upper surface do not reach the channel region and ions injected from the side surface of the gate electrode reach the channel region), it is necessary to consider a standard deviation of the vertical distribution of the implanted ions, $\Delta R_p$, to establish the acceleration energy.

Implantation depth at this time is taken to be $R_p+n\Delta R_p$. However, n is a positive number (n>0), and this equation is established so as to account for implantation depth including n times standard deviation $\Delta R_p$ of the projected range. Additionally, the number of multiples of the standard deviation to be accounted for in the foregoing equation may be determined from required transistor characteristics.

Figure 11A:
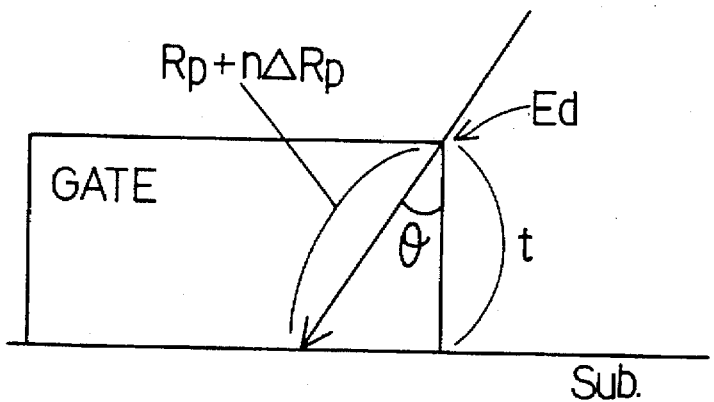

As shown in FIG. 11A, in a case of ion implantation obliquely with respect to a substrate (Sub), when an angle made with a perpendicular direction with respect to the substrate (Sub) is taken to be an implantation angle θ, and when a sum of thickness of the gate oxide film 12, gate electrode 13 and film 14 of FIG. 10 is taken to be t, geometrical distance from an edge portion Ed of the gate electrode (edge portion Ed of the film 14 in FIG. 10) to the substrate as seen from the implantation angle θ direction becomes t/cos θ.

Figure 11B:
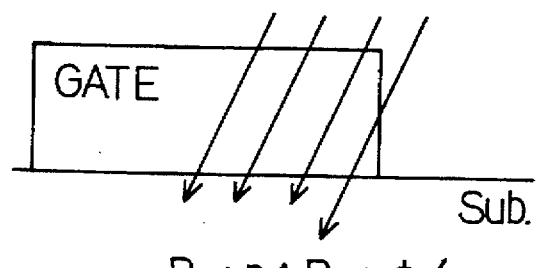

As shown in FIG. 11B, when implantation depth is $R_p+n\Delta R_p>t/\cos θ$, ions implanted not only from the side surface of the gate electrode but also from the gate-electrode upper surface pass through the gate electrode and reach the substrate (Sub).

Figure 11C:
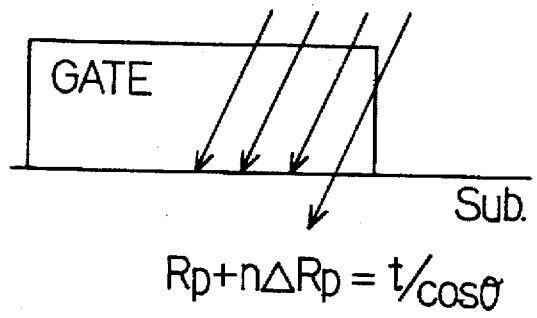

Additionally, as shown in FIG. 11C, when implantation depth is $R_p+n\Delta R_p=t/\cos θ$, ions implanted from the upper surface of the gate electrode just reach the surface of the substrate (Sub).

Figure 11D:
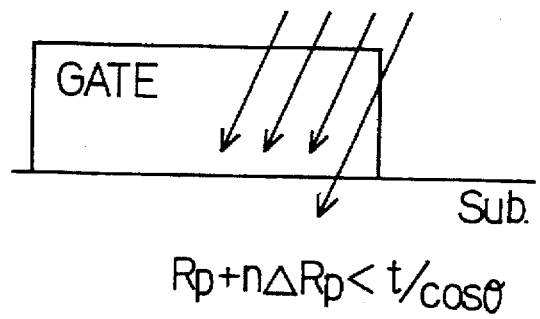

Accordingly, as shown in FIG. 11D, when $R_p+n\Delta R_p<t/\cos θ$, ions implanted from the upper surface of the gate electrode come to be implanted only in the gate electrode. Consequently, it is required that oblique ion implantation be performed with this condition.

By performing oblique ion implantation such as this, the high-concentration P-type region 17 is formed only in the proximity of the source region 15b as shown in FIG. 10, and expansion of the high-concentration P-type region 17 to the drain region 15a side can be still further eliminated. Consequently, width of the gate electrode 13, i.e., gate length in transistor terms, can be further narrowed, and compactness of the transistor can be achieved thereby.

Additionally, although the positional relationship between the drain region 15a and the high-concentration P-type region 17 is established by the position of the photoresist 16 in the foregoing first embodiment, according to the present embodiment, since the upper surface 132 of the gate electrode 13 also functions as an implantation mask, the extremely precise position of the photoresist 16 is not required.

Additionally, FIG. 10 indicates an example where photoresist 16 covered the drain region 15a and a portion of the gate electrode 13. However, provision of a photoresist 16 is not required in a case where a region where ions are implanted has been determined in one direction, and moreover in a case where the high-concentration P-type region 17 does not become deeper than drain diffusion depth, or in a case of establishment of a condition whereby ions are not implanted in the drain region.

When a threshold voltage identical with the first embodiment is achieved, acceleration energy of the ions being implanted can be reduced in comparison with the first embodiment, and so it becomes possible to reduce damage to the gate oxide film 12 due to implanted ions.

FIG. 12 indicates a fourth embodiment according to the present invention.

This fourth embodiment performs ion implantation from an oblique direction to form a high-concentration P-type region 17, similarly to the foregoing third embodiment. FIG. 12 indicates a portion corresponding to the step in FIG. 2C.

A point of difference from the third embodiment is that a gate electrode 13 is made up of a laminated structure of a polycrystalline silicon portion 13a and a tungsten silicide (WSi$_2$) portion 13b.

WSi$_2$ causes a small projected range compared with silicon. For example, if a projected range through WSi$_2$ is assumed to be R$_p$(WSi$_2$) and a projected range through silicon is assumed to be R$_p$(Si), in case boron ions (B$^+$) are implanted with an acceleration energy of 100 keV, R$_p$(WSi$_2$)=1,440 Å, and R$_p$(Si)=2,968 Å. That is to say, R$_p$(WSi$_2$) is approximately half of R$_p$(Si). Briefly, if acceleration energy is equal, boron ions come to advance in WSi$_2$ only half of the distance when passing through silicon. Consequently, when performing ion implantation, ions injected from a side surface of the gate electrode pass through to the channel region, whereas ions injected from an upper surface of the gate electrode can reliably be prevented because the WSi$_2$ functions as an ion-implantation inhibiting region at the time of ion implantation.

Furthermore, in the side surface of the gate electrode as well, even if ions implanted from a side surface 131a of the polycrystalline silicon portion 13a can reach the substrate surface, ions passing through a side surface 131b of the WSi$_2$ portion 13b do not reach the substrate surface. Consequently, only ions implanted from a lower side surface of the gate electrode 13' can reach the substrate surface, and so formation of the high-concentration P-type region 17 more proximately to the source region 15b becomes possible.

Accordingly, a structure which suppresses leakage current as indicated in the first embodiment can be supported even when significant minuteness is achieved.

This is not limited merely to a fabrication process to form a high-concentration P-type region to regulate threshold voltage according to the present invention, but is also effective when forming an LDD region to cause to alleviate an electrical field in a source region or drain region. In this case, dopant ions of the same conductivity type as the source region or drain region are implanted to form the LDD region as indicated, for example, in FIG. 8. Furthermore, it is also effective when forming a source region and drain region in order to define an effective channel length with high accuracy.

That is to say, when ion implantation is performed so as to cause passage through a side surface of a gate electrode to form a doped region disposed below the gate electrode, in a case where further heightening of positional accuracy of an end portion of the doped region is required in accompaniment to minuteness of the device, projected range can be caused to be changed sharply in the side surface 131b of the WSi$_2$ portion 13b of FIG. 12, and so the end portion of the doped region can be formed with favorable accuracy. By means of this, fluctuation in the threshold voltage, for example, can be suppressed.

Briefly, in a case where projected range is regulated by acceleration voltage as in the third embodiment, distribution of the end portion of the formed high-concentration P-type region becomes correspondingly large even if acceleration energy is regulated, due to reasons such as film-thickness fluctuation of the gate electrode, fluctuation in acceleration energy given to the implanted ions, minute change in film quality of the gate electrode, and the like. However, by providing a member differing in projected range under the identical acceleration voltage on a surface or an intermediate portion of the gate electrode as in the present embodiment, a channel region in which ions are implanted and a region in which ions are not implanted can be clearly separated with the member as the divider. Therefore, it is sufficient merely to consider only expansion in the horizontal direction of ion implantation. Consequently, the end portion of the high-concentration P-type region can be formed with favorable precision.

Furthermore, because the WSi$_2$ is a metal compound, there also exists effective in reducing the resistance value of the gate electrode.

To summarize the foregoing, adopting a laminated structure for a gate electrode and employing a metal compound for an upper-layer portion as described above does not merely cause a resistance value of the gate electrode to be lowered but also can cause the implanted dopant therethrough not to reach the substrate surface, and so there exists an effect of enabling positioning of the end portion of the doped region with greater accuracy in comparison with a time when the projected range of ion implantation is controlled only by acceleration energy as in the third embodiment.

Additionally, it is not necessarily required that a laminated structure of polycrystalline silicon and WSi$_2$ be employed for the gate electrode of laminated structure to obtain the above-described effect; it is sufficient to employ a material having an atomic weight wherein an upper-layer portion is heavier than a lower-layer portion. This is because the implanted ion is more scattered when passing through a region having a heavy atomic weight than when passing through a region having a light atomic weight, and thereby the projected range becomes small. Additionally, when consideration is given to the nature as an electrode, it is acceptable to employ a metal material having a low resistance value.

Furthermore, when the lower-layer portion of the gate electrode is made of a silicon-based material, a material having a heavier atomic weight than silicon and which forms a silicide can be employed as the upper-layer portion of the gate electrode which becomes an ion-interrupting layer. There are for example WSi$_2$, MoSi$_2$, TiSi$_2$, CoSi$_2$, and the like. Because these tungsten, molybdenum, titanium, and cobalt have a heavier atomic weight than silicon, ability to suppress penetration of implanted ions is high. Any other metal which has a heavier atomic weight than silicon is applicable as an upper-layer portion of a gate electrode which becomes an ion-interruption layer.

A fabrication process of the semiconductor device indicated in FIG. 12 will be described hereinafter with reference to FIGS. 13A through 13F.

Figure 13A:
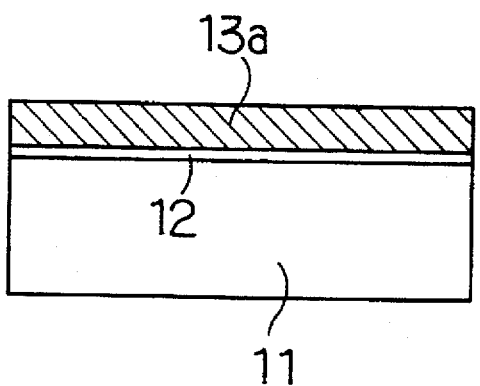
Figure 13B:
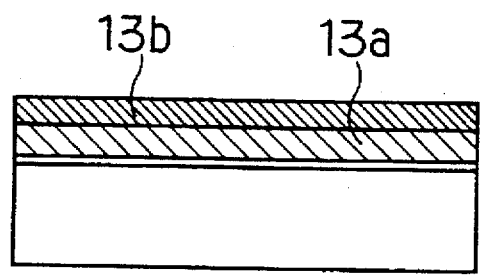

In the step shown in FIG. 13A, a P-type silicon substrate (or P-type well) 11 is prepared, and a gate oxide film 12 is formed. Next, polycrystalline silicon 13a is deposited to form a gate electrode. Thereafter, in the step shown in FIG. 13B, a silicide (metal-silicide compound) layer 13b made up of for example WSi$_2$ is formed by a sputtering, vapor-deposition method or CVD method as an ion-interruption layer on an upper portion of the polycrystalline silicon 13a.

Figure 13C:
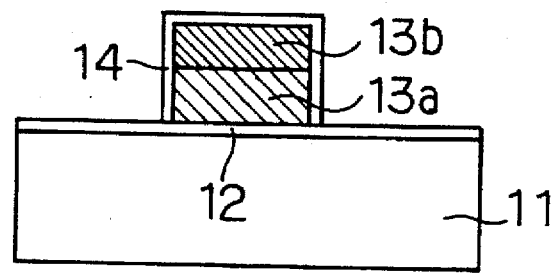
Figure 13D:
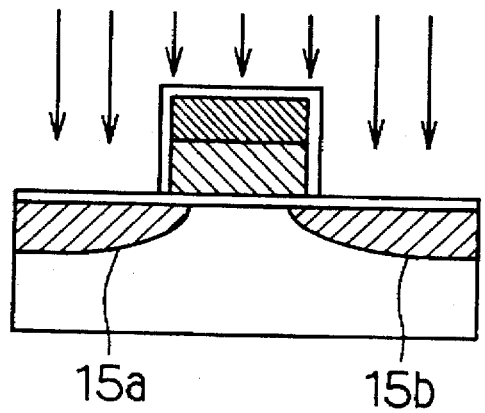

Thereafter, in the step shown in FIG. 13C, anisotropic etching is performed to pattern the polycrystalline silicon 13a and silicide layer 13b, and a polycide (two-layer structure of metal-silicide compound and polycrystalline silicon) is formed as a gate electrode 13'. Thereafter, in the step shown in FIG. 13D, an oxide film 14 is formed as required. Thereafter, arsenic or phosphorus or both are ion-implanted as an N-type dopant to thereby form a drain region 15a and source region 15b.

Figure 13E:
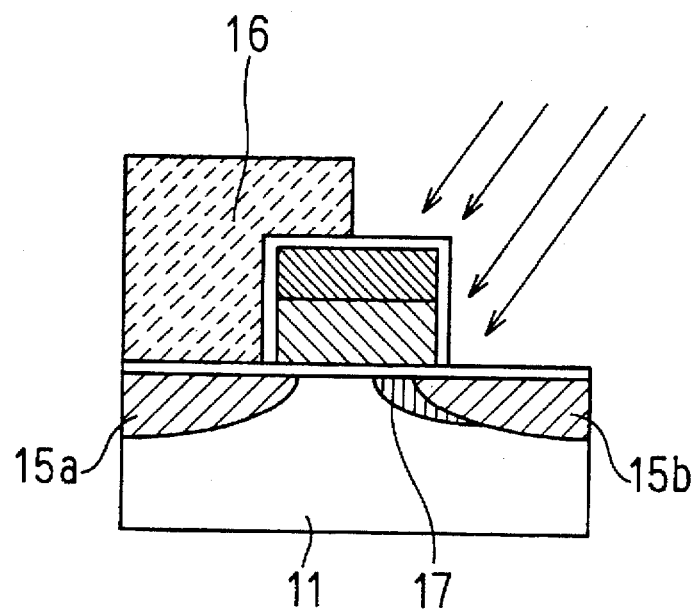
Figure 13F:
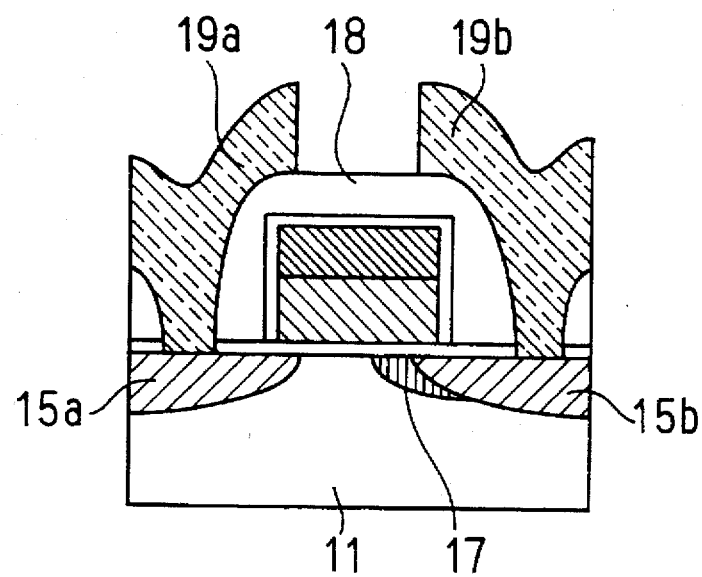

Next, in the step shown in FIG. 13E, ROM data writing, i.e., ion implantation of boron to cause a threshold voltage to be raised, is performed in a state in which a photoresist 16 has been formed. In this case, a high-concentration P-type region 17 can reliably be formed from an end portion of the drain region 15a with a predetermined distance interposed therebetween as described for the first embodiment, according to a relationship of the injection angle, acceleration voltage (acceleration energy), and dose amount of the boron ions. Additionally, threshold voltage can be established at a predetermined value by causing distance from the source region 15b and concentration to be predetermined values. Thereafter, in the step indicated in FIG. 13F, the photoresist 16 is peeled off, a layer insulation film 18 of for example a PSG film, BPSG film or the like is formed over the entire surface by a method of for example CVD, sputtering, vapor deposition or the like, contact holes are made in portions where drain and source electrodes are disposed, and a metal film of aluminum or the like is vapor-deposited and patterned to form a drain electrode 19a and source electrode 19b.

A different method for forming the silicide layer 13b is indicated in FIGS. 14A through 14D. This represents a salicide process. In the step shown in FIG. 14A, in a state where a gate oxide film 12 and polycrystalline silicon film 13a which becomes a portion of a gate electrode have been patterned on a P-type semiconductor substrate (or P-type well region) 11, an insulation film which is an oxide film or the like is deposited over the entire surface by the sputtering method or CVD method and etching back is performed, thereby forming a side wall 20 on a side surface of the patterned polycrystalline silicon film 13a, and thereafter ion implantation is performed to form a drain region 15a and source region 15b.

Thereafter, in the step indicated in FIG. 14B, a film of a metal material 21 of tungsten, molybdenum, titanium, cobalt or the like which has a heavier atomic weight than silicon is formed over the entire surface by a sputtering or evaporation method. Thereafter, in the step shown in FIG. 14C, reaction layers 22, 23a, and 23b are formed on an upper portion of the polycrystalline silicon film 13a, drain region 15a, and source region 15b by performed heat treatment. Thereafter, in the step shown in FIG. 14D, the unreacted regions of the metal material 21 are removed by selective wet etching, and a silicide layer 13b is formed on the polycrystalline silicon film 13a by heat treatment thereafter. Additionally, silicide layers 24a and 24b are simultaneously formed on the drain region 15a and source region 15b as well. Steps thereafter are identical with the steps indicated in FIGS. 13E and 13F, and description will be omitted.

In a forming method for an enhancement-type ROM indicated in FIGS. 13A through 13F or FIGS. 14A through 14D, penetration of ions implanted from the upper surface of the gate-electrode can be substantially completely inhibited by the silicide layer 13b which becomes an ion-interruption layer. In particular, according to the method shown in FIGS. 14A through 14D, the metal material 21 deposited on the upper portion of the polycrystalline silicon film 13a becomes thick due to the volume expansion during the silicification thereof, the resultant silicide layer 13b is thickened, and therefore the inhibition effect to the ion penetration described above is remarkable. Because of this effect, according to these methods of the fourth embodiment, reliable, stabilized establishment of threshold voltage with little fluctuation becomes possible. Furthermore, the end portion of the high-concentration P-type region can be established at a predetermined position with high accuracy due to the existence of the silicide layer 13b which becomes an ion-interruption layer, and so it becomes possible to cause the threshold voltage to be raised while suppressing increase in leakage current, even when minuteness of gate-electrode width, i.e., gate length, progresses to approximately 0.5 µm. The same can also be said when forming an LDD structure not illustrated, or when forming merely a source region or drain region.

Additionally, structuring of an enhancement-type ROM by N-channel transistors was described according to the above-described various embodiments, but completely identical effects can be realized even when reversing all conductivity types and structuring the foregoing enhancement-type ROM with P-channel transistors.

In this case, structure becomes the same as in FIG. 1, and a high-concentration N-type region is formed in a channel region with respect to P-type source and drain regions. In a case where P-channel transistors are employed in this way, the drain region is the negative side and large voltage is applied, and so if the drain region and the high-concentration N-type region are contiguous, a problem of leakage current due to the PN junction there between occurs. Consequently, the high-concentration N-type region is formed remotely from the drain region by a distance determined similarly to the device indicated in FIG. 1.

That is to say, the high-concentration P-type or N-type region is located remotely by that distance from either the drain region or the source region to which is applied a large voltage reverse-biasing a PN junction defined between itself and the channel region during the actual usage.

Moreover, application of a semiconductor device according to the present invention in a ROM was indicated in the foregoing embodiments, but application is also possible not only in another semiconductor memory device (for example a memory of two-layer gate-electrode structure, such as an EPROM, EEPROM or the like); application similarly in an semiconductor device of MOS structure employed in a logic circuit is also possible.

Furthermore, transistors formed on a substrate (P-type semiconductor substrate) are explained in the foregoing various embodiments, but forming in a so-called well region formed in a semiconductor substrate is also possible.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor region of a first conductivity type;
   a gate electrode disposed on said semiconductor region with a gate insulation film interposed therebetween;
   a source region and a drain region, each being a second conductivity type, disposed at a surface portion of said semiconductor region, whereby a channel region is defined at said surface portion of said semiconductor region between said drain region and said source region below said gate electrode; and a high-concentration region of said first conductivity type disposed overlapping with said channel region and having an impurity concentration higher than an impurity concentration of said surface portion of said semiconductor region, wherein said high-concentration region is disposed remotely from both said source region and said drain region, and an end portion thereof is located at a position where an electrical field within a depletion layer which extends within said semiconductor region from a PN junction between said drain region and said semiconductor region toward said high-concentration region does not become the critical field causing an avalanche breakdown or a Zener breakdown when a rated voltage is applied between said drain region and said semiconductor region.

2. A semiconductor device according to claim 1, wherein said position of said end portion of said high-concentration region is selected in association with said rated voltage so as to prevent said depletion layer from expanding inside said high-concentration region during a period when a voltage not more than said rated voltage is applied between said drain region and said semiconductor region.

3. A semiconductor device according to claim 1, wherein said position of said end portion of said high-concentration region is selected in association with said rated voltage so as to prevent said depletion layer from reaching said high-concentration region during a period when a voltage not more than said rated voltage is applied between said drain region and said semiconductor region.

4. A semiconductor device according to claim 1, wherein said gate electrode has a multilayered structure of a first layer and a second layer located on said first layer, said second layer being composed of a material which has a atomic weight heavier than said first layer.

5. A semiconductor device according to claim 4, wherein said first layer of said gate electrode is of silicon, and said second layer of said gate electrode is of a metal silicide.

6. A semiconductor device according to claim 5, wherein said metal silicide making up said second layer is selected from a group consisting of $WSi_2$, $MoSi_2$, $TiSi_2$ and $CoSi_2$.

7. A semi-conductor device comprising:

a semiconductor region of a first conductivity type;

a gate electrode disposed on said semiconductor region with a gate insulation film interposed therebetween;

a source region and a drain region, each being a second conductivity type, disposed at a surface portion of said semiconductor region, whereby a channel region is defined at said surface portion of said semiconductor region between said drain region and said source region below said gate electrode; and a high-concentration region of said first conductivity type disposed overlapping with said channel region and having an impurity concentration higher than an impurity concentration of said surface portion of said semiconductor region, wherein said high-concentration region is disposed remotely from both said source region and said drain region.

8. A semiconductor device according to claim 7, wherein said position of said end portion of said high-concentration region is selected in association with said rated voltage so as to prevent said depletion layer from expanding inside said high-concentration region during a voltage not more than said rated voltage is applied between said drain region and said semiconductor region.

9. A semiconductor device according to claim 7, wherein said position of said end portion of said high-concentration region is selected in association with said rated voltage so as to prevent said depletion layer from reaching said high-concentration region during a voltage not more than said rated voltage is applied between said drain region and said semiconductor region.

10. A semiconductor device according to claim 7, wherein an end portion of said high-high-concentration region is located at a position where an electrical field within a depletion layer which extends within said semiconductor region from a PN junction between said drain region and said semiconductor region toward said high-concentration region does not become the critical field causing an avalanche breakdown or a Zener breakdown when a rated voltage is applied between said drain region and said semiconductor region.

* * * * *